(12) United States Patent
Yamada et al.

(10) Patent No.: US 7,794,854 B2
(45) Date of Patent: Sep. 14, 2010

(54) CORANNULENE COMPOUND AND ORGANIC LIGHT-EMITTING DEVICE

(75) Inventors: Naoki Yamada, Inagi (JP); Kazunori Ueno, Ebina (JP); Jun Nishimura, Maebashi (JP); Yukihiro Okada, Gunma-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 231 days.

(21) Appl. No.: 11/466,127

(22) Filed: Aug. 22, 2006

(65) Prior Publication Data

US 2007/0049779 A1    Mar. 1, 2007

(30) Foreign Application Priority Data

Aug. 26, 2005    (JP) .............................. 2005-245220

(51) Int. Cl.
*H01L 51/54*    (2006.01)
*C09K 11/06*    (2006.01)

(52) U.S. Cl. ..................... 428/690; 428/917; 313/504; 313/506; 585/27; 585/26; 564/434; 564/426

(58) Field of Classification Search ................ None
See application file for complete search history.

(56) References Cited

U.S. PATENT DOCUMENTS 6,652,997 B2    11/2003    Suzuki et al. ............... 428/690

(Continued)

FOREIGN PATENT DOCUMENTS

JP    2002-324678    11/2002

OTHER PUBLICATIONS

Tetrahedron, 57, (2001), p. 3737-3742.*

(Continued)

*Primary Examiner*—Dawn Garrett
(74) *Attorney, Agent, or Firm*—Fitzpatrick, Cella, Harper & Scinto

(57) ABSTRACT

Provided is a novel corannulene compound. The corannulene compound is represented by the following general formula (1):

General formula (1)

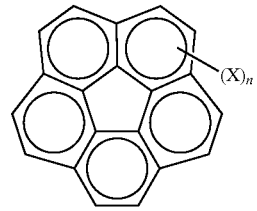

where X represents a substituted or unsubstituted aryl group, a substituted or unsubstituted heterocyclic group, a substituted or unsubstituted amino group, or a substituted or unsubstituted cyano group, n represents an integer of 1 to 10, and when a number of X is two or more, X may be identical to or different from each other, or may bind to each other to form a ring.

5 Claims, 2 Drawing Sheets

U.S. PATENT DOCUMENTS

| | | | |
|---|---|---|---|
| 6,916,555 B2 | 7/2005 | Suzuki et al. | 428/690 |
| 6,998,182 B2 | 2/2006 | Saitoh et al. | 428/690 |
| 7,129,386 B2 | 10/2006 | Saitoh et al. | 585/26 |
| 7,173,131 B2 | 2/2007 | Saitoh et al. | 544/336 |
| 7,229,702 B2 | 6/2007 | Saitoh et al. | 428/690 |
| 7,232,618 B2 | 6/2007 | Yamada et al. | 428/690 |
| 2001/0008711 A1* | 7/2001 | Igarashi | 428/690 |
| 2004/0076853 A1* | 4/2004 | Jarikov | 428/690 |
| 2004/0247937 A1* | 12/2004 | Chen et al. | 428/690 |
| 2004/0253389 A1 | 12/2004 | Suzuki et al. | 428/1.1 |
| 2005/0236974 A1 | 10/2005 | Suzuki et al. | 313/504 |
| 2005/0236977 A1 | 10/2005 | Yamada et al. | 313/504 |
| 2005/0244670 A1 | 11/2005 | Saitoh et al. | 428/690 |
| 2006/0017376 A1 | 1/2006 | Okinaka et al. | 313/504 |
| 2006/0051616 A1 | 3/2006 | Suzuki et al. | 428/690 |
| 2006/0068221 A1 | 3/2006 | Saitoh et al. | 428/609 |
| 2006/0115678 A1 | 6/2006 | Saitoh et al. | 428/690 |
| 2006/0121312 A1 | 6/2006 | Yamada et al. | 428/690 |
| 2006/0125378 A1 | 6/2006 | Saitoh et al. | 313/504 |
| 2006/0134425 A1 | 6/2006 | Suzuki et al. | 428/411.1 |
| 2006/0166034 A1 | 7/2006 | Saitoh et al. | 428/690 |
| 2006/0286408 A1 | 12/2006 | Suzuki et al. | 428/690 |
| 2007/0111029 A1 | 5/2007 | Yamada et al. | 428/690 |

OTHER PUBLICATIONS

Grube et al., Organic Letters, (2003), vol. 5, No. 5, p. 713-716.*
Morita et al., Organic Letters, (2004), vol. 6, No. 9, p. 1397-1400.*
Sygula et al., Organic Letters, (2005), vol. 7, No. 22, p. 4999-5001.*
Polyhedron, 24, (2005), p. 2200-2204.*
Lin et al., J. Phys. Chem. B, (2005), vol. 109, p. 13755-13760.*
Barth et al., Journal of the American Chemical Society, (1971), 93(7), p. 1730-45.*
Seiders, et al.; "Synthesis of Corannulene and Alkyl Derivatives of Corannulene"; J. Am. Chem. Soc.; vol. 121; pp. 7804-7813; (1999).
Sygula, et al.; "A Practical, large Scale Synthesis of the Corannulene System"; J. Am. Chem. Soc.; vol. 122; pp. 6323-6324; (2000).

* cited by examiner

CORANNULENE COMPOUND AND ORGANIC LIGHT-EMITTING DEVICE

BACKGROUND OF THE INVENTION

1. Field of the Invention

The present invention relates to a novel corannulene compound and an organic light-emitting device.

2. Description of the Related Art

An organic light-emitting device includes: an anode; a cathode; and a thin film containing a fluorescent organic compound or a phosphorescent organic compound, the thin film being interposed between the anode and the cathode. An electron and a hole are injected from the respective electrodes. Then, an exciton of the fluorescent organic compound or of the phosphorescent organic compound is generated. The device utilizes light to be radiated when the exciton returns to its ground state.

Recent progress in an organic light-emitting device is remarkable. The organic light-emitting device is characterized in that it can be turned into a thin, lightweight light-emitting device which: provides high luminance at a low applied voltage; and has the diversity of a luminous wavelength and high-speed responsiveness. The characteristic suggests the potential of the light-emitting device to find use in a wide variety of applications.

Japanese Patent Application Laid-Open No. 2002-324678 describes an example of a light-emitting material in which pyrene is substituted by a benzene ring and an example of an organic light-emitting device using it. The document describes that a device having good light-emitting property and good durability is provided.

However, the device of Japanese Patent Application Laid-Open No. 2002-324678 has low external quantum efficiency, and the document has no specific description concerning the durable lifetime of the device.

In addition, conventionally known organic light-emitting devices including, but not limited to, the device of Japanese Patent Application Laid-Open No. 2002-324678 each require optical output with additionally high luminance or high conversion efficiency. In addition, each of the devices still involves many problems in terms of durability such as a change with time due to long-term use and deterioration due to, for example, an atmospheric gas containing oxygen or humidity. Further, when one attempts to apply each of the devices to a full-color display or the like, each of blue light, green light, and red light must be emitted at a good color purity. However, problems concerning the emission have not been sufficiently solved yet.

SUMMARY OF THE INVENTION

An object of the present invention is to provide a novel corannulene (dibenzo[ghi,mno]fluoranthene) compound.

Another object of the present invention is to provide an organic light-emitting device which: uses a corannulene compound; and has optical output with extremely high efficiency and extremely high luminance. Another object of the present invention is to provide an extremely durable organic light-emitting device. Another object of the present invention is to provide an organic light-emitting device that can be easily produced at a relatively low cost.

Accordingly, the present invention provides a corannulene compound represented by the following general formula (1):

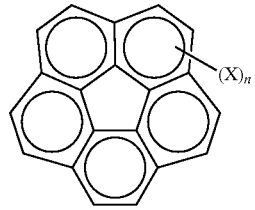

General formula (1)

where X represents a substituted or unsubstituted aryl group, a substituted or unsubstituted heterocyclic group, a substituted or unsubstituted amino group, or a substituted or unsubstituted cyano group, n represents an integer of 1 to 10, and when a number of X is two or more, X may be identical to or different from each other, or may bind to each other to form a ring.

The present invention further provides an organic light-emitting device which includes: a pair of electrodes composed of an anode and a cathode; and one or multiple layers each containing an organic compound, the one or multiple layers being interposed between the pair of electrodes, in which at least one layer of the one or multiple layers each containing an organic compound contains at least one kind of a compound of the following general formula (2):

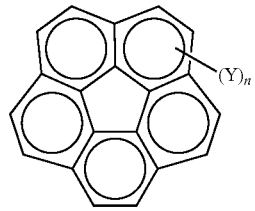

General formula (2)

where Y represents a substituted or unsubstituted alkyl group, a substituted or unsubstituted aralkyl group, a substituted or unsubstituted aryl group, a substituted or unsubstituted heterocyclic group, a substituted or unsubstituted amino group, a substituted or unsubstituted cyano group, or a substituted or unsubstituted halogen group, n represents an integer of 0 to 10, and when a number of Y is two or more, Y may be identical to or different from each other, or may bind to each other to form a ring.

According to the present invention, a novel corannulene compound represented by the general formula (1) can be synthesized.

In addition, an organic light-emitting device using a corannulene compound represented by the general formula (2) of the present invention provides highly efficient light emission at a low applied voltage. Excellent durability can also be obtained.

Further features of the present invention will become apparent from the following description of exemplary embodiments (with reference to the attached drawings).

DESCRIPTION OF THE EMBODIMENTS

Figure 1:
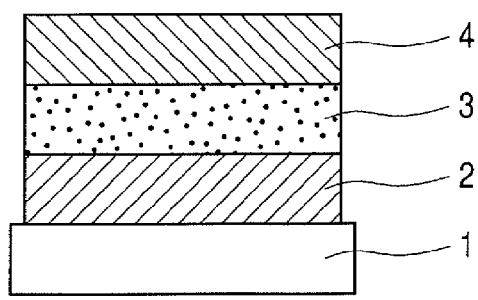
FIG. 1 is a sectional view showing an example of an organic light-emitting device in the present invention.

The present invention relates to a novel corannulene compound. Further, the inventors of the present invention have found not only the novel corannulene compound but also the fact that a corannulene compound can be used in an organic light-emitting device. Therefore, the present invention also relates to a novel organic light-emitting device having a corannulene compound as well.

A novel corannulene compound according to the present invention is a corannulene compound represented by the following general formula (1):

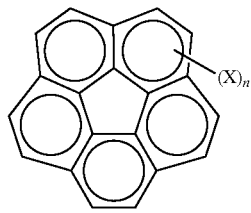

General formula (1)

where X represents a substituted or unsubstituted aryl group, a substituted or unsubstituted heterocyclic group, a substituted or unsubstituted amino group, or a substituted or unsubstituted cyano group, n represents an integer of 1 to 10, and when a number of X is two or more, X may be identical to or different from each other, or may bind to each other to form a ring.

Further, a novel organic light-emitting device according to the present invention is an organic light-emitting device which includes: a pair of electrodes composed of an anode and a cathode; and one or multiple layers each containing an organic compound, the one or multiple layers being interposed between the pair of electrodes, in which at least one layer of the one or multiple layers each containing an organic compound contains at least one kind of a compound of the following general formula (2):

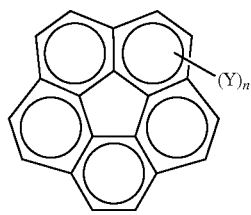

General formula (2)

where Y represents a substituted or unsubstituted alkyl group, a substituted or unsubstituted aralkyl group, a substituted or unsubstituted aryl group, a substituted or unsubstituted heterocyclic group, a substituted or unsubstituted amino group, a substituted or unsubstituted cyano group, or a substituted or unsubstituted halogen group, n represents an integer of 0 to 10, and when a number of Y is two or more, Y may be identical to or different from each other, or may bind to each other to form a ring.

A corannulene compound represented by the general formula (1) or (2) can be mainly used as a material for an organic light-emitting device. When the corannulene compound is used for a light-emitting layer in the device, the compound can be used alone in the light-emitting layer, and can be used for a dopant (i.e., guest) material or a host material. As a result, a device having a high color purity, high luminous efficiency, and a long lifetime can be obtained.

Hereinafter, the invention will be described in more detail.

Specific examples of substituents of compounds in the general formulae (1) and (2) are shown below.

Examples of the alkyl group include a methyl group, an ethyl group, an n-propyl group, an iso-propyl group, an n-butyl group, a ter-butyl group, a sec-butyl group, an octyl group, a 1-adamantyl group, and a 2-adamantyl group.

Examples of the aralkyl group include a benzyl group and a phenethyl group.

Examples of the aryl group include a phenyl group, a naphthyl group, a pentalenyl group, an indenyl group, an azulenyl group, an anthryl group, a pyrenyl group, an indacenyl group, an acenaphthenyl group, a phenanthryl group, a phenalenyl group, a fluoranthenyl group, an acephenanthyl group, an aceanthryl group, a triphenylenyl group, a chrysenyl group, a naphthacenyl group, a perylenyl group, a pentacenyl group, a biphenyl group, a terphenyl group, and a fluorenyl group.

Examples of the heterocyclic group include a thienyl group, a pyrrolyl group, a pyridyl group, an oxazolyl group, an oxadiazolyl group, a thiazolyl group, a thiadiazolyl group, a terthienyl group, a carbazolyl group, an acridinyl group, and a phenathrolyl group.

Examples of the substituted amino group include a dimethylamino group, a diethylamino group, a dibenzylamino group, a diphenylamino group, a ditolylamino group, and a dianisolylamino group.

Examples of the halogen group include fluorine, chlorine, bromine, and iodine.

Examples of substituents which the above-mentioned substituents may have include: alkyl groups such as a methyl group, an ethyl group, and a propyl group; aralkyl groups such as a benzyl group and a phenethyl group; aryl groups such as a phenyl group and a biphenyl group; heterocyclic groups such as a thienyl group, a pyrrolyl group, and a pyridyl group; amino groups such as a dimethylamino group, a diethylamino group, a dibenzylamino group, a diphenylamino group, a ditolylamino group, and a dianisolylamino group; alkoxyl groups such as a methoxyl group, an ethoxyl group, a propoxyl group, and a phenoxyl group; and halogen atoms such as a cyano group, fluorine, chlorine, bromine, and iodine.

An example of the structure of a compound to be preferably used in an organic light-emitting device among those compounds of the general formulae (1) and (2) is given below. It is needless to say that the present invention is not limited to these compounds with shown structures.

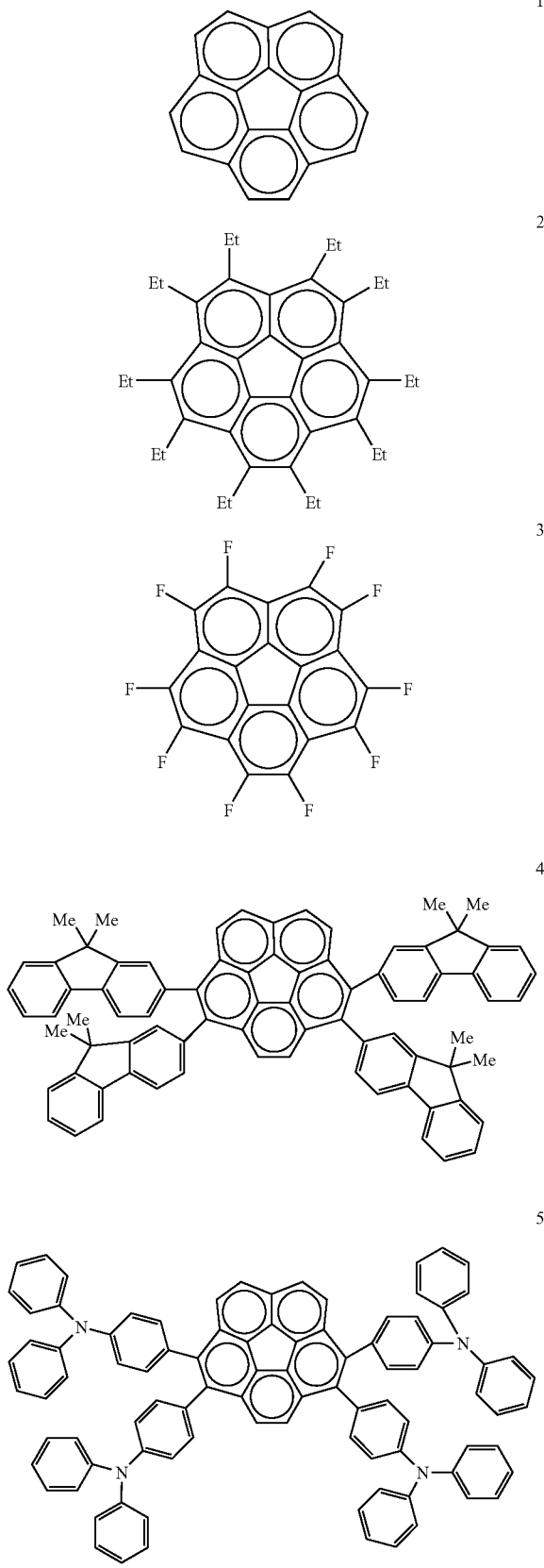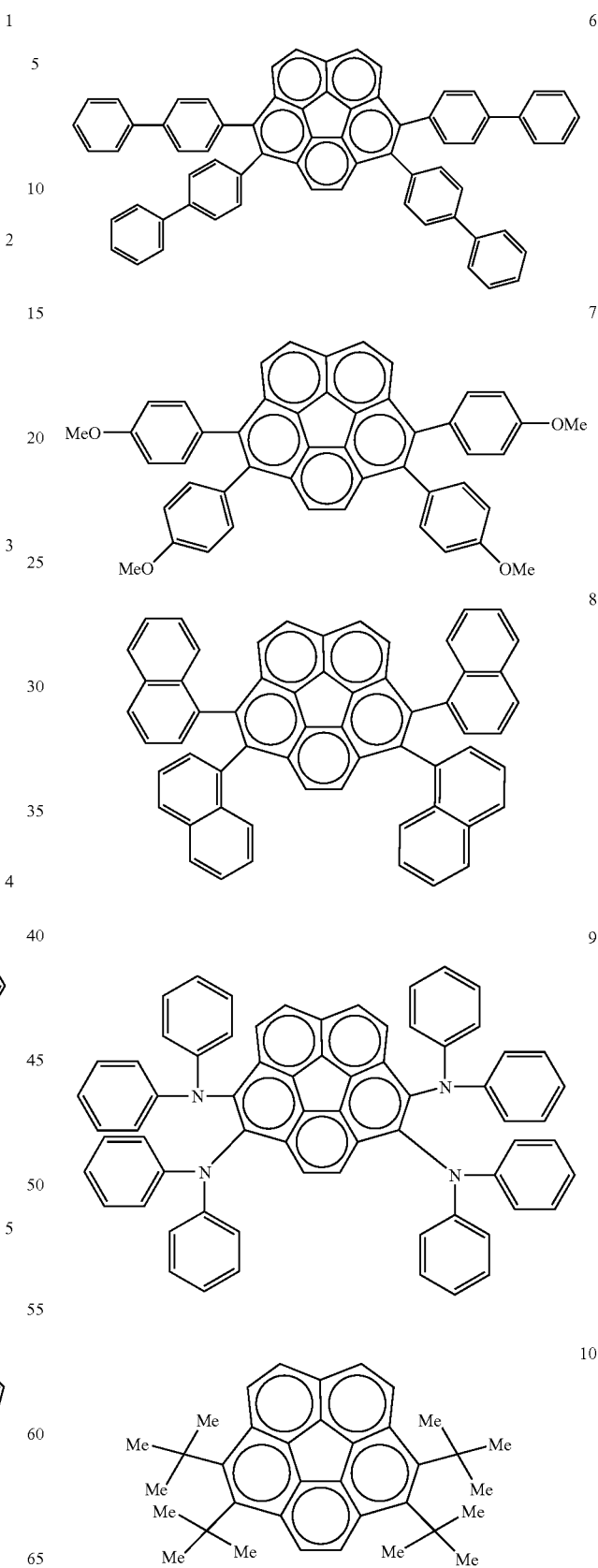

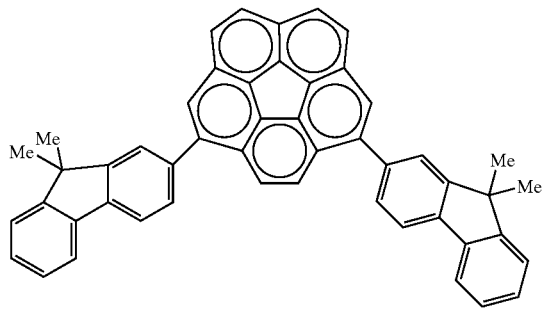

11

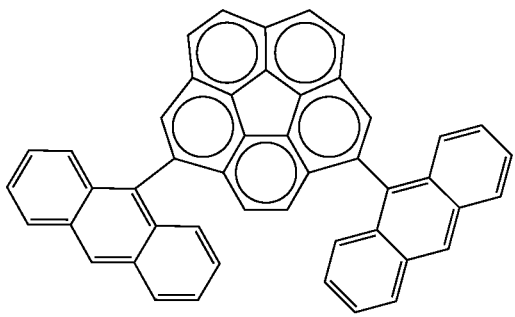

12

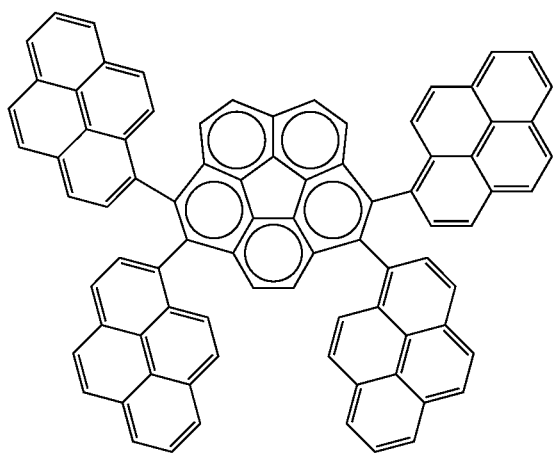

13

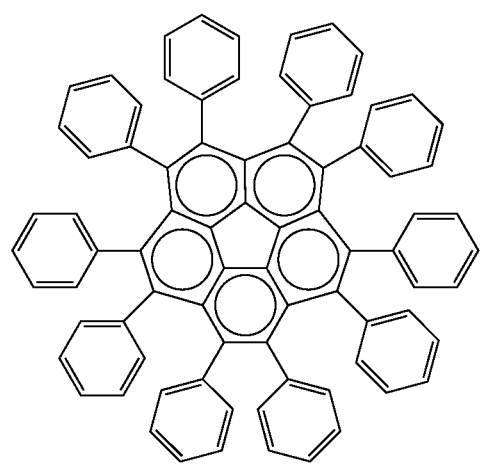

14

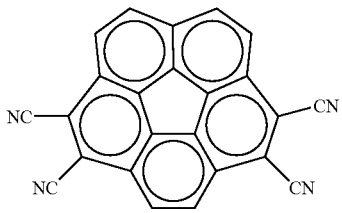

15

Next, an organic light-emitting device of the present invention will be described in detail.

The organic light-emitting device of the present invention includes at least: a pair of electrodes composed of an anode and a cathode; and one or multiple layers each containing an organic compound, the one or multiple layers being interposed between the pair of electrodes. In the organic light-emitting device, at least one layer of the one or multiple layers each containing an organic compound contains at least one kind of a compound represented by the general formula (1).

FIGS. 1 to 5 each show a preferable example of the organic light-emitting device of the present invention.

Numerals of the respective figures are described.

Reference numeral 1 represents a substrate; 2, an anode; 3, a light-emitting layer; 4, a cathode; 5, a hole-transporting layer; 6, an electron-transporting layer; 7, a hole-injecting layer; and 8, a hole and/or exciton-blocking layer.

FIG. 1 is a sectional view showing an example of the organic light-emitting device of the present invention. FIG. 1 shows a constitution in which the anode 2, the light-emitting layer 3, and the cathode 4 are sequentially provided on the substrate 1. A light-emitting device to be used here is useful when the device itself has hole-transporting property, electron-transporting property, and light-emitting property alone or when compounds having the respective properties are used as a mixture.

Figure 2:
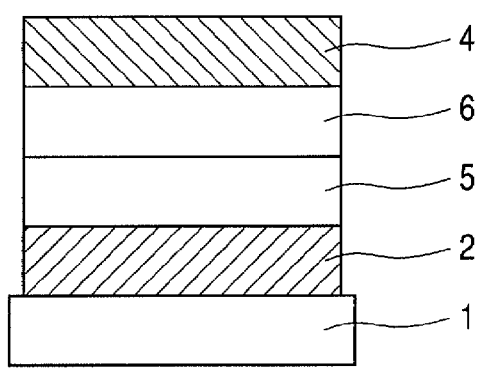
FIG. 2 is a sectional view showing another example of the organic light-emitting device in the present invention.

FIG. 2 is a sectional view showing another example of the organic light-emitting device of the present invention. FIG. 2 shows a constitution in which the anode 2, the hole-transporting layer 5, the electron-transporting layer 6, and the cathode 4 are sequentially provided on the substrate 1. This case is useful when a material having one or both of hole-transporting property and electron-transporting property is used in each layer and a light-emitting substance is used in combination with a mere hole-transporting substance or electron-transporting substance having no light-emitting property. In addition, in this case, the light-emitting layer 3 is composed of the hole-transporting layer 5 or the electron-transporting layer 6.

Figure 3:
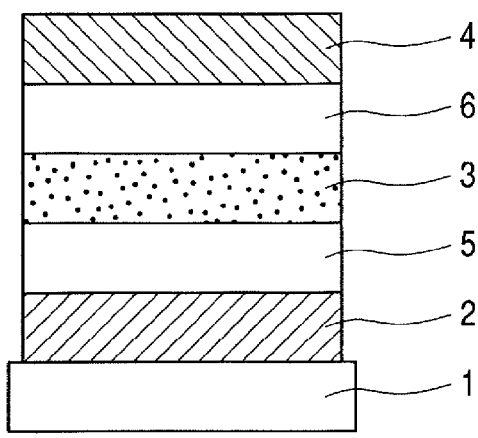
FIG. 3 is a sectional view showing another example of the organic light-emitting device in the present invention.

FIG. 3 is a sectional view showing another example of the organic light-emitting device of the present invention. FIG. 3 shows a constitution in which the anode 2, the hole-transporting layer 5, the light-emitting layer 3, the electron-transporting layer 6, and the cathode 4 are sequentially provided on the substrate 1. In this constitution, a carrier-transporting function and a light-emitting function are separated from each other. In addition, the constitution is timely used in combination with a compound having hole-transporting property, electron-transporting property, and light-emitting property. As a result, the degree of freedom in the selection of a material extremely increases, and various compounds different from each other in luminous wavelength can be used, so the diversification of luminescent hues can be achieved. Further, each carrier or exciton can be effectively trapped in the light-emitting layer 3 as a central layer, so an improvement in luminous efficiency can be achieved.

Figure 4:
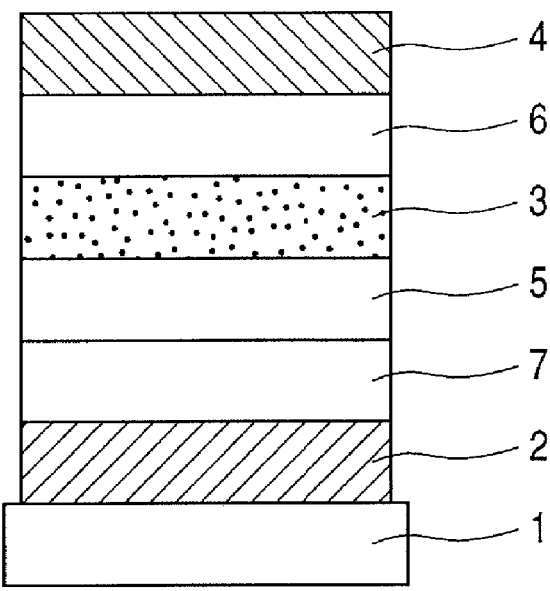
FIG. 4 is a sectional view showing another example of the organic light-emitting device in the present invention.

FIG. 4 is a sectional view showing another example of the organic light-emitting device of the present invention. FIG. 4 shows a constitution different from that shown in FIG. 3 in that the hole-injecting layer 7 is inserted between the anode 2 and the hole-transporting layer 5. The constitution has an improving effect on adhesiveness between the anode 2 and the hole-transporting layer 5 or on hole-injecting property, and is effective for a reduction in voltage.

Figure 5:
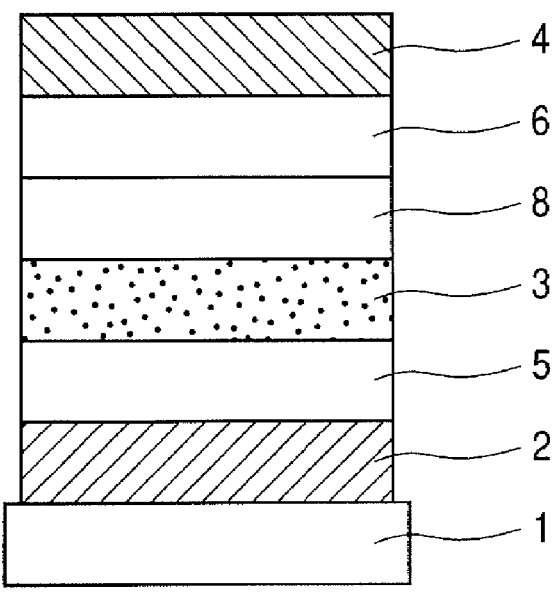
FIG. 5 is a sectional view showing another example of the organic light-emitting device in the present invention.

FIG. 5 is a sectional view showing another example of the organic light-emitting device of the present invention. FIG. 5 shows a constitution different from that shown in FIG. 3 in that a layer for inhibiting the escape of a hole or an exciton to the side of the cathode 4 (i.e., hole/exciton-blocking layer 8) is inserted between the light-emitting layer 3 and the electron-transporting layer 6. The constitution is effective for an improvement in luminous efficiency because a compound having an extremely high ionization potential is used in the hole/exciton-blocking layer 8.

It should be noted that FIGS. 1 to 5 each merely show an extremely basic device constitution, and the constitution of an organic light-emitting device using the compound of the present invention is not limited to these constitutions. The device can adopt any one of various layer constitutions such as a constitution in which an insulating layer, an adhesive layer, or an interference layer is provided for an interface between an electrode and an organic layer and a constitution in which a hole-transporting layer is constituted of two layers different from each other in ionization potential.

The compound represented by the general formula (1) to be used in the present invention can be used in any one of the forms shown in FIGS. 1 to 5.

In particular, an organic layer using the compound of the present invention is useful as a light-emitting layer, an electron-transporting layer, or a hole-transporting layer, and a layer formed by a vacuum vapor deposition method, a solution application method, or the like hardly undergoes crystallization or the like and is excellent in stability with time.

In the present invention, the compound represented by the general formula (1) is used particularly as a component of a light-emitting layer; provided that, for example, any one of conventionally known low-molecular weight-based or polymer-based hole-transporting materials, luminous materials, and electron-transporting materials can be used together as required.

Examples of those materials are given below.

A hole-injecting/transporting material preferably has excellent mobility which: facilitates the injection of a hole from an anode; and transports the injected hole to a light-emitting layer. Examples of low-molecular weight-based and polymer-based materials each having hole-injecting/transporting performance include, but of course not limited to, a triarylamine derivative, a phenylenediamine derivative, a triazole derivative, an oxadiazole derivative, an imidazole derivative, a pyrazoline derivative, a pyrazolone derivative, an oxazole derivative, a fluorenone derivative, a hydrazone derivative, a stilbene derivative, a phthalocyanine derivative, a porphyrin derivative, poly(vinylcarbazole), poly(silylene), poly(thiophene), and any other conductive polymer. Part of specific examples are shown below.

Low-molecule weight-based hole-injecting/transporting material

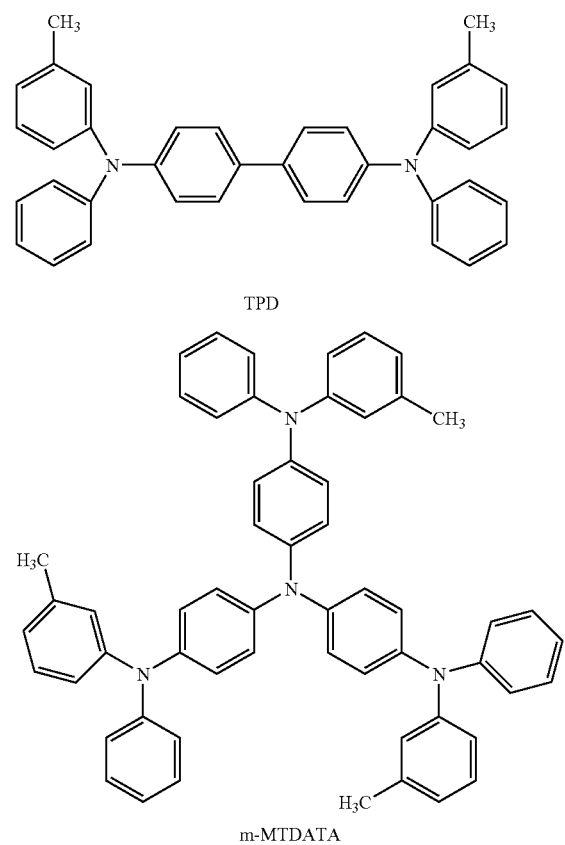

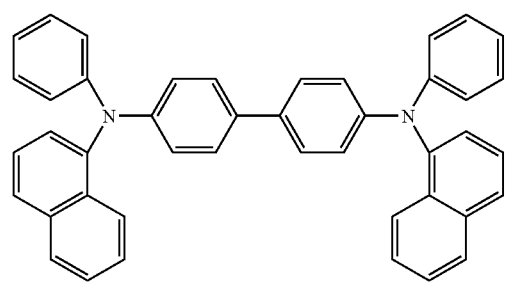

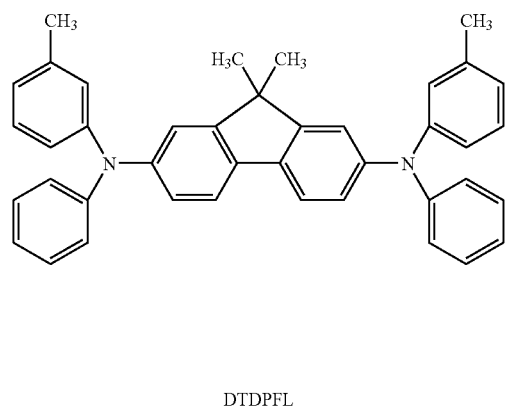

-continued
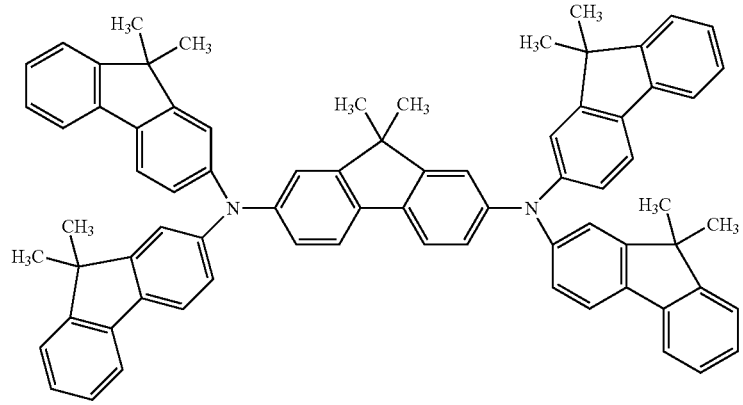
TFLFL
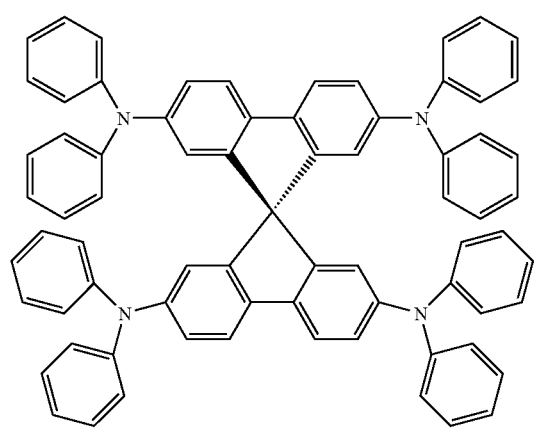
spiro-TPD
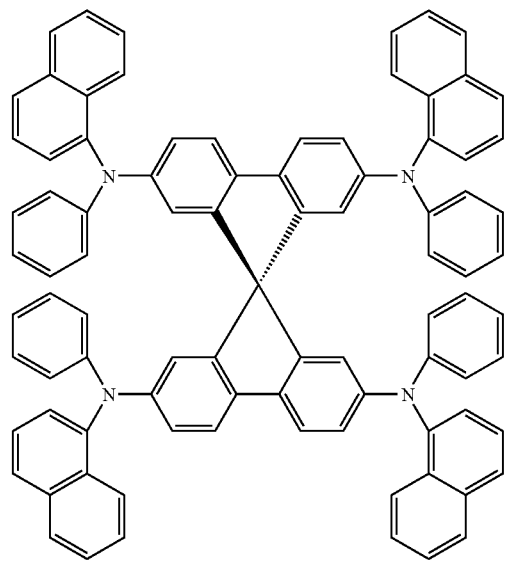
spiro-NPD
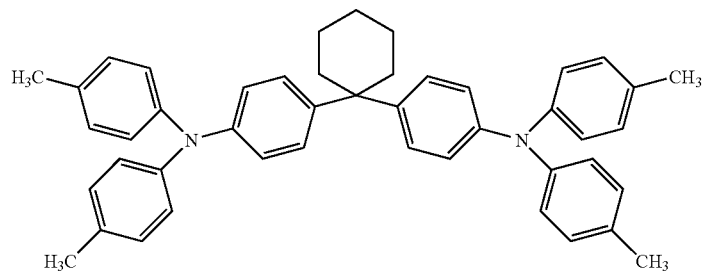
TPAC
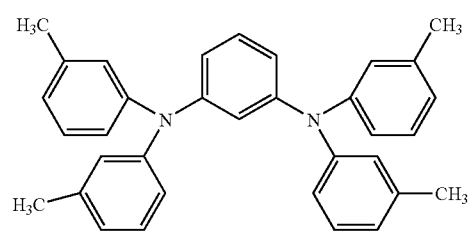
PDA -continued
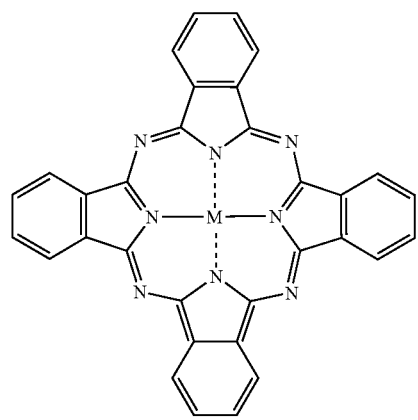
Pc-M
M: Cu, Mg, AlCl, TiO, SiCl₂, Zn, Sn, MnCl, GaCl, etc
Polymer-based hole-transporting material
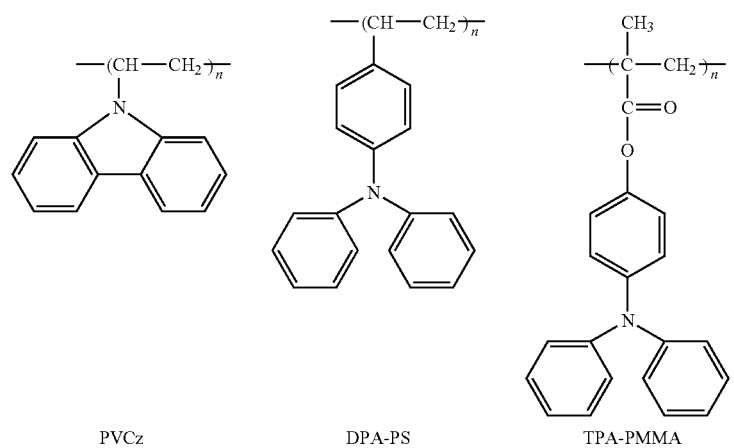
PVCz　　　DPA-PS　　　TPA-PMMA
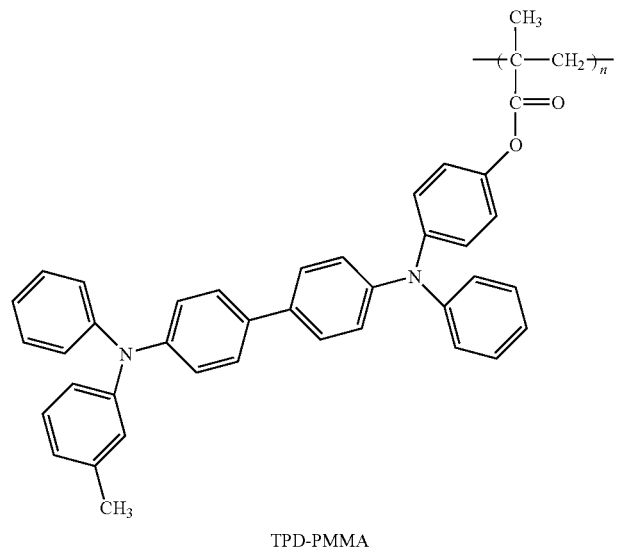
TPD-PMMA

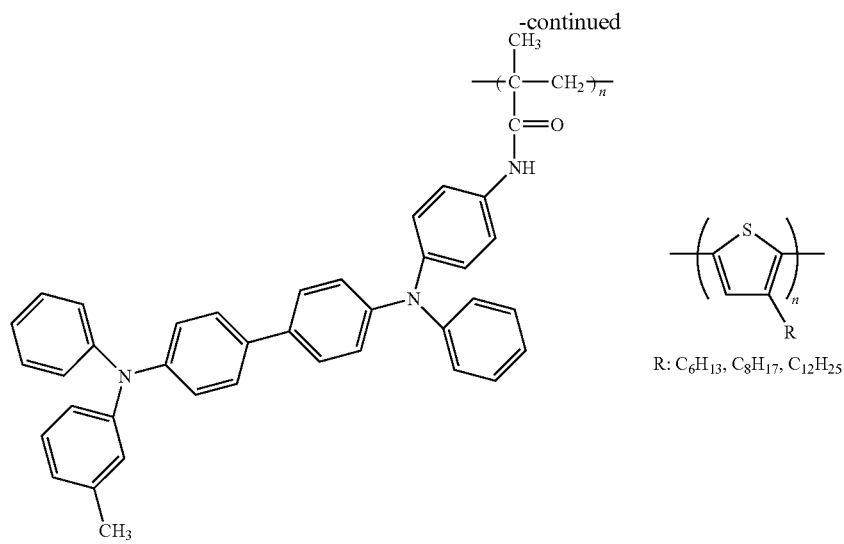

TPD-PMAA

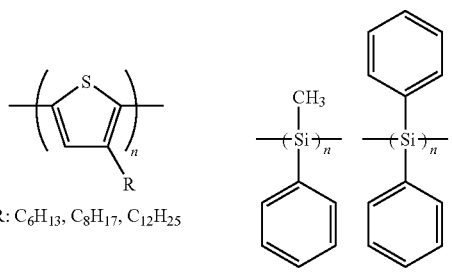

Poly thiophene    Polysilane

R: $C_6H_{13}, C_8H_{17}, C_{12}H_{25}$

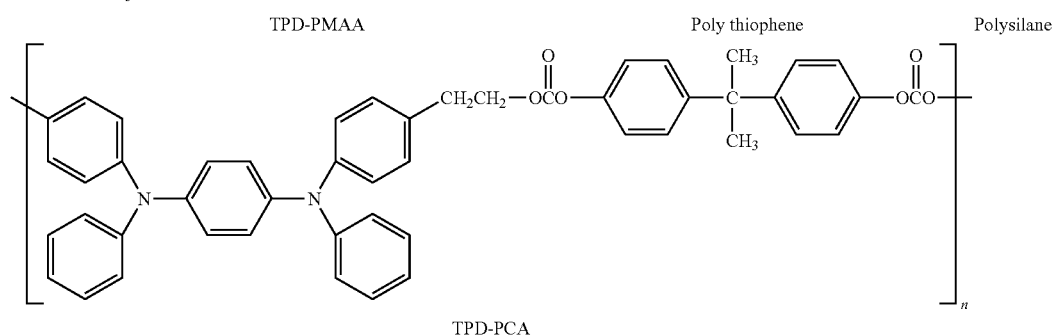

TPD-PCA

Next, a luminous material will be described.

The corannulene compound represented by the general formula (1) or (2) according to the present invention can be used in a light-emitting layer because the compound itself can emit light.

Further, the corannulene compound represented by the general formula (1) or (2) according to the present invention can not only be used in a light-emitting layer but also function as a so-called host material of which the light-emitting layer of an organic light-emitting device is mainly composed.

In that case, it can be said that light emitted from a light-emitting central material as a guest in the light-emitting layer is light emitted from the organic light-emitting device.

Examples of the light-emitting central material in this case include, but of course not limited to: a polycyclic fused aromatic compound (such as a naphthalene derivative, a phenanthrene derivative, a fluorene derivative, a pyrene derivative, a tetracene derivative, a coronene derivative, a chrysene derivative, a perylene derivative, a 9,10-diphenylanthracene derivative, or rubrene); a quinacridone derivative; an acridone derivative; a coumarin derivative; a pyrane derivative; Nile Red; a pyrazine derivative; a benzoimidazole derivative; a benzothiazole derivative; a benzoxazole derivative; a stilbene derivative; an organometallic complex (such as an organic aluminum complex such as tris(8-quinolinolato)aluminum or an organic beryllium complex); and a polymer derivative such as a poly(phenylenevinylene) derivative, a poly(fluorene) derivative, a poly(phenylene) derivative, a poly(thienylenevinylene) derivative, or a poly(acetylene) derivative. Part of specific examples are shown below.

Low-molecular weight-based light-emitting material

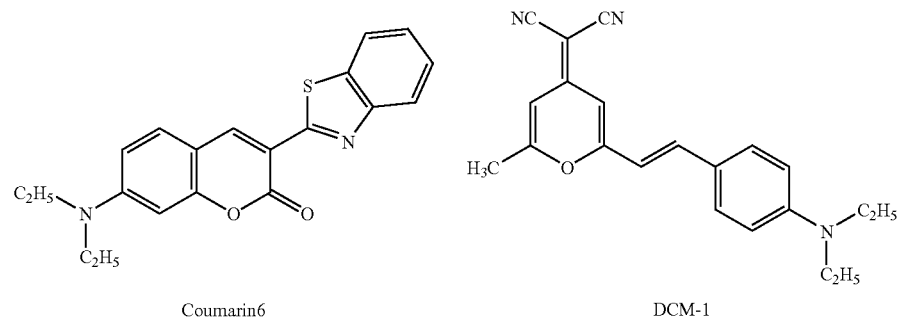

Coumarin6    DCM-1

-continued
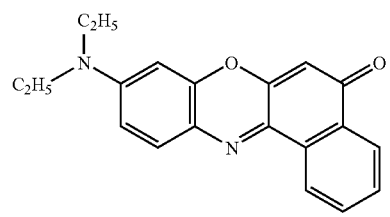
Nile red
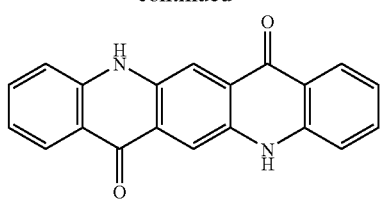
Quinacridone
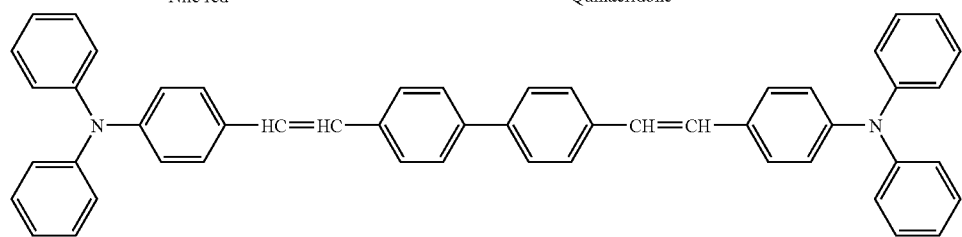
DTPABVi
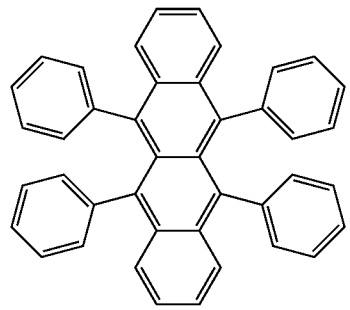
Rubrene
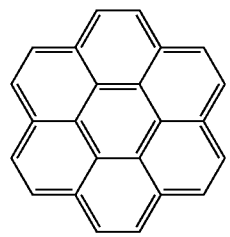
Coronene
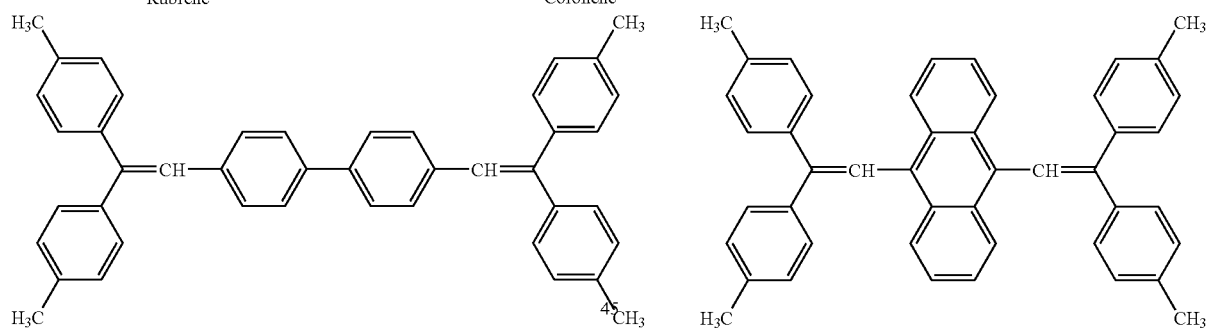
Polymer-based light-emitting material
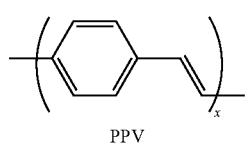
PPV
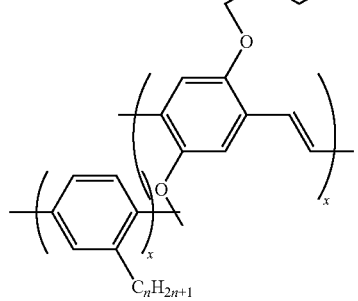
-continued
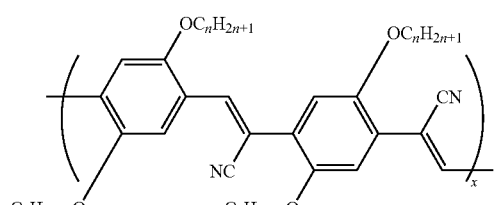
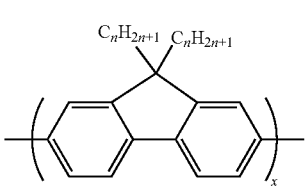
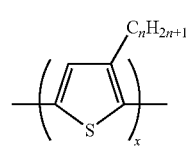

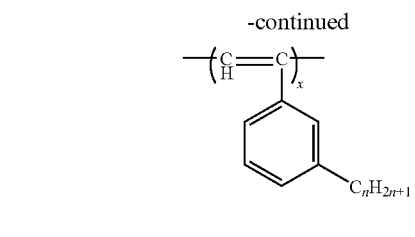

Metal complex-based light-emitting material

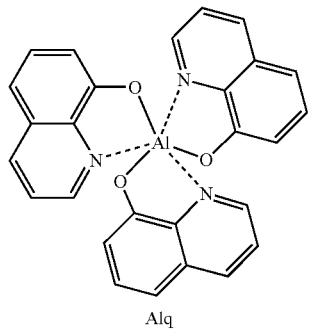

Alq

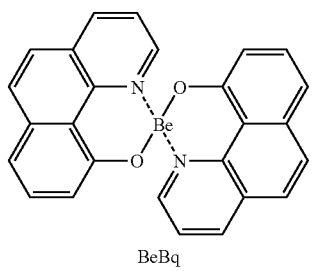

BeBq

An electron-injecting/transporting material can be arbitrarily selected from those each having a function of facilitating the injection of an electron from a cathode and a function of transporting the injected electron to a light-emitting layer, and is selected in consideration of, for example, a balance with the carrier mobility of a hole-transporting material. Examples of a material having electron-injecting/transporting performance include, but of course not limited to, an oxadiazole derivative, an oxazole derivative, a thiazole derivative, a thiadiazole derivative, a pyrazine derivative, a triazole derivative, a triazine derivative, a perylene derivative, a quinoline derivative, a quinoxaline derivative, a fluorenone derivative, an anthrone derivative, a phenanthroline derivative, and an organometallic complex. Part of specific examples are shown below.

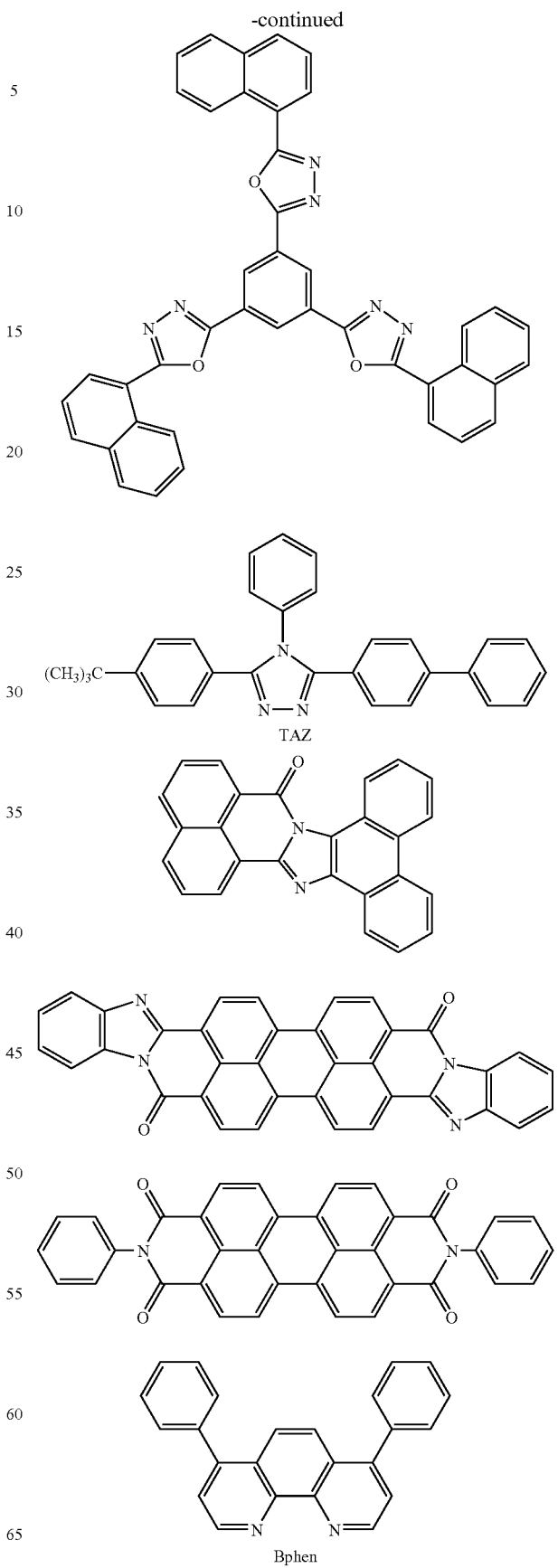

-continued

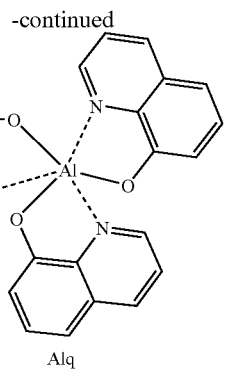

Alq

In the organic light-emitting device of the present invention, a layer containing the corannulene compound represented by the general formula (1) or (2), or a layer composed of any other organic compound can be formed by, for example, any one of the following methods. That is, each of the layers is formed as a thin film by a vacuum vapor deposition method, an ionized deposition method, sputtering, plasma, or a known application method involving dissolving a material for the layer in an appropriate solvent. Examples of the application method include spin coating, dipping, a cast method, an LB method, and an ink jet method. In particular, when a film is formed by an application method, the film can be formed in combination with an appropriate binder resin.

The above-mentioned binder resin can be selected from a wide variety of binding resins, and examples of the binder resin include, but not limited to, a polyvinyl carbazole resin, a polycarbonate resin, a polyester resin, a polyallylate resin, a polystyrene resin, an ABS resin, a polybutadiene resin, a polyurethane resin, an acrylic resin, a methacrylic resin, a butyral resin, a polyvinyl acetal resin, a polyamide resin, a polyimide resin, a polyethylene resin, a polyether sulfone resin, a diallyl phthalate resin, a phenol resin, an epoxy resin, a silicone resin, a polysulfone resin, and a urea resin.

Each of those resins may be used alone.

Alternatively, each of copolymers each containing at least, as a monomer unit of the copolymer, a monomer unit of which any one of those resins is constituted may be used alone.

Alternatively, those resins may be mixed together, those copolymers may be mixed together, or those resins and copolymers may be mixed.

Two or more kinds of components may be used upon mixing.

Further, a known additive such as a plasticizer, an antioxidant, or a UV absorber may be used in combination as required.

An anode material desirably has as large a work function as possible, and any one of: metal elements such as gold, platinum, silver, copper, nickel, palladium, cobalt, selenium, vanadium, and tungsten, and alloys of the elements; and metal oxides such as tin oxide, zinc oxide, indium oxide, indium tin oxide (ITO), and indium zinc oxide can be used. A conductive polymer such as polyaniline, polypyrrole, polythiophene, or polyphenylene sulfide can also be used. Each of those electrode materials can be used alone, or two or more of them can be used in combination. In addition, an anode may adopt a single-layer constitution or a multilayer constitution.

Meanwhile, a cathode material desirably has a small work function, and any one of: metal elements such as lithium, sodium, potassium, calcium, magnesium, aluminum, indium, ruthenium, titanium, manganese, yttrium, silver, lead, tin, and chromium; and alloys each composed of two or more of the elements such as a lithium-indium alloy, a sodium-potassium alloy, a magnesium-silver alloy, an aluminum-lithium alloy, an aluminum-magnesium alloy, and a magnesium-indium alloy can be used. A metal oxide such as indium tin oxide (ITO) can also be used. Each of those electrode materials can be used alone, or two or more of them can be used in combination. In addition, a cathode may adopt a single-layer constitution or a multilayer constitution.

In addition, at least one of the anode and the cathode is desirably transparent or semi-transparent.

A substrate to be used in the present invention includes, not particularly limited, an opaque substrate such as a metallic substrate or a ceramic substrate, or a transparent substrate such as glass, quartz; or a plastic sheet is used. In addition, colored light can be controlled by using, for example, a color filter film, a fluorescent color conversion filter film, or a dielectric reflective film as a substrate. In addition, a device can be produced by: producing a thin film transistor (TFT) on a substrate; and connecting the transistor to the substrate.

In addition, each of a bottom emission constitution (i.e., constitution in which light is extracted from the side of a substrate) and a top emission constitution (i.e., constitution in which light is extracted from the side opposite to the substrate) can be adopted for the direction in which light is extracted from a device.

It should be noted that a produced device may be provided with a protective layer or a sealing layer for the purpose of preventing the device from contacting with oxygen, moisture, or the like. Examples of the protective layer include: an inorganic material film such as a diamond thin film, a metal oxide, or a metal nitride; a polymer film such as a fluorine resin, polyparaxylene, polyethylene, a silicone resin, or a polystyrene resin; and a photocurable resin. Alternatively, the device itself can be covered with, for example, glass, a gas impermeable film, or a metal, and can be packaged with an appropriate sealing resin.

EXAMPLES

Hereinafter, the present invention will be described more specifically by way of examples. However, the present invention is not limited to these examples.

Synthesis Example 1

(Synthesis of Exemplified Compound 1 and Compound 1-1 (tetrabromocorannulene))

Exemplified Compound 1 and Compound 1-1 (tetrabromocorannulene) were synthesized by using 2,7-dimethylnaphthalene as a raw material as shown in Scheme 1. Reference can be made to J. Am. Chem. Soc., Vol. 122, No. 26, 2000, and J. Am. Chem. Soc., Vol. 121, No. 34, 1999 upon synthesis.

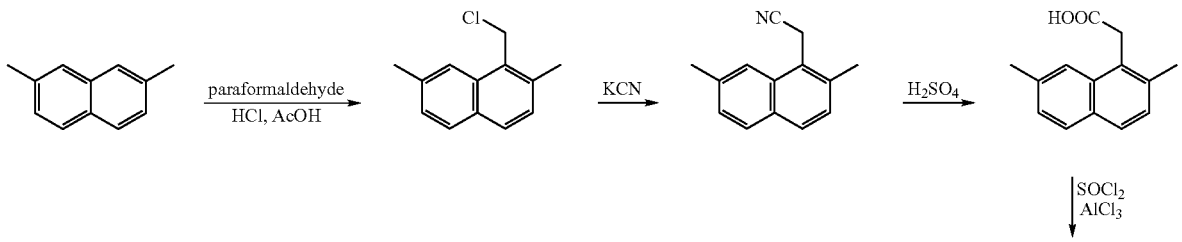

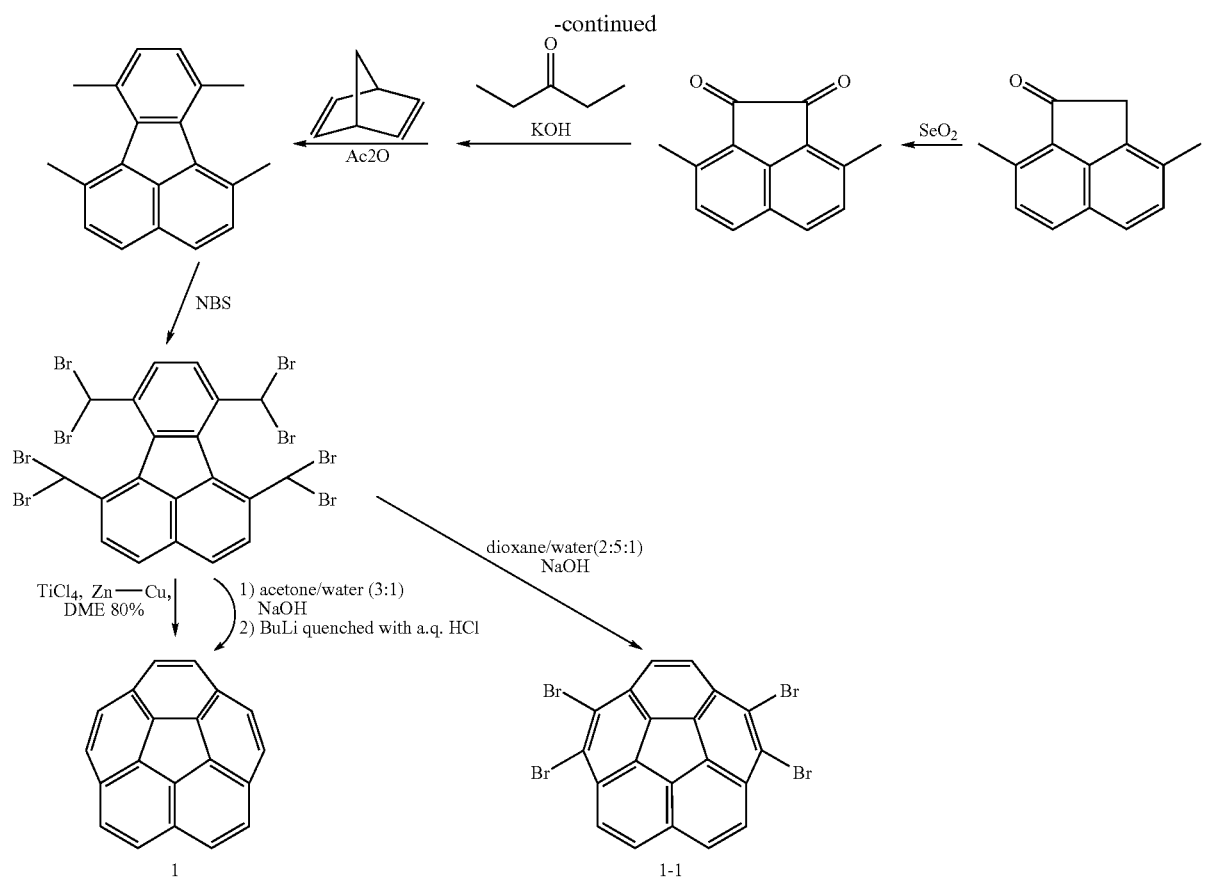

Example 1

(Synthesis of Exemplified Compound 4)

A 500-ml three-necked flask was prepared. 0.268 g (0.48 mmol) of Compound 1-1, 1.13 g (4.8 mmol) of 2-(9,9-dimethyl)fluoreneboric acid, 120 ml of toluene, and 60 ml of ethanol were placed into the flask. Then, in a nitrogen atmosphere, an aqueous solution prepared by dissolving 24 g of sodium carbonate in 120 ml of water was dropped to the resultant mixture while the mixture was stirred at room temperature. Next, 0.33 g (0.28 mmol) of tetrakis(triphenylphosphine)palladium(0) was added. After the resultant had been stirred at room temperature for 30 minutes, the temperature of the resultant was increased to 77° C., and then the resultant was stirred for 5 hours. After the reaction, an organic layer was extracted with chloroform, dried with anhydrous sodium sulfate, and purified by using a silica gel column (containing mixed developing solvent of hexane and toluene), whereby 0.36 g of Exemplified Compound 4 (white crystal) was obtained (75% yield).

Examples 2 and 3

(Synthesis of Exemplified Compounds 5 and 8)

Each of Exemplified Compounds 5 and 8 was synthesized in the same manner as in Example 1 except that 4-diphenylaminobenzeneboric acid or 1-naphthaleneboric acid was used instead of 2-(9,9-dimethyl)fluoreneboric acid.

Example 4

An organic light-emitting device having the structure shown in FIG. 3 was produced by the following method.

Indium tin oxide (ITO) was formed into a film having a thickness of 120 nm by a sputtering method on a glass substrate as the substrate 1 to serve as the anode 2, and the resultant was used as a transparent, conductive supporting substrate. The substrate was subjected to ultrasonic cleaning with acetone and isopropyl alcohol (IPA) sequentially. Next, the substrate was subjected to boiling cleaning with IPA and dried. Further, the substrate was subjected to UV/ozone cleaning, and was used as a transparent, conductive supporting substrate.

A chloroform solution was prepared by using a compound represented as a hole-transporting material by the following structural formula in such a manner that the concentration of the solution would be 0.1 wt %.

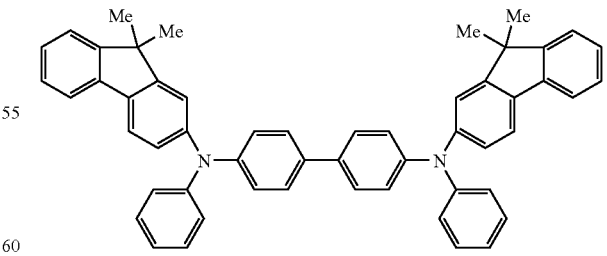

The solution was dropped onto the above-mentioned ITO electrode, and the whole was subjected to spin coating at an initial number of revolutions of 500 RPM for 10 seconds and then at a number of revolutions of 1,000 RPM for 1 minute, whereby a film was formed. After that, the resultant was dried in a vacuum oven at 80° C. for 10 minutes, whereby the solvent in the thin film was completely removed. The formed hole-transporting layer 5 had a thickness of 11 nm. Next, Exemplified Compound 4 described above to serve as the light-emitting layer 3 was vapor-deposited onto the hole-transporting layer 5, whereby the light-emitting layer 3 having a thickness of 20 nm was provided. Film formation was performed under the conditions of a degree of vacuum at the time of the vapor deposition of $1.0 \times 10^{-4}$ Pa and a film formation rate of 0.2 to 0.3 nm/sec.

Further, bathophenanthroline (Bphen) was formed into a film having a thickness of 40 nm by a vacuum vapor deposition method to serve as the electron-transporting layer 6. Film formation was performed under the conditions of a degree of vacuum at the time of the vapor deposition of $1.0 \times 10^{-4}$ Pa and a film formation rate of 0.2 to 0.3 nm/sec.

Next, a vapor deposition material composed of an aluminum-lithium alloy (having a lithium concentration of 1 atomic %) was used to form a metal layer film having a thickness of 0.5 nm on the foregoing organic layer by a vacuum vapor deposition method. Further, an aluminum film having a thickness of 150 nm was provided by a vacuum vapor deposition method, whereby an organic light-emitting device using an aluminum-lithium alloy film as an electron-injecting electrode (i.e., cathode 4) was produced. Film formation was performed under the conditions of a degree of vacuum at the time of the vapor deposition of $1.0 \times 10^{-4}$ Pa and a film formation rate of 1.0 to 1.2 nm/sec.

The resultant organic light-emitting device was covered with a protective glass plate in a dry air atmosphere in order that the device might be prevented from deteriorating owing to the adsorption of moisture, and was sealed with an acrylic resin-based adhesive.

A voltage of 4.0 V was applied to the device thus obtained while the ITO electrode (i.e., anode 2) was used as a positive electrode and the Al electrode (i.e., cathode 4) was used as a negative electrode. As a result, the device was observed to emit blue light having an emission luminance of 480 cd/m², a luminous efficiency of 2.2 lm/W, and a center wavelength of 465 nm.

Further, a voltage was applied for 100 hours under a nitrogen atmosphere while a current density was kept at 30 mA/cm². As a result, an initial luminance of 490 cd/m² reduced to 395 cd/m² in 100 hours. This means that luminance deterioration was small.

Comparative Example 1

A device was produced in the same manner as in Example 4 except that a comparative compound shown below was used instead of Exemplified Compound 4, and was evaluated in the same manner as in Example 4. The device was observed to emit blue light having an emission luminance of 350 cd/m², a luminous efficiency of 1.6 lm/W, and a center wavelength of 460 nm at an applied voltage of 4.0 V.

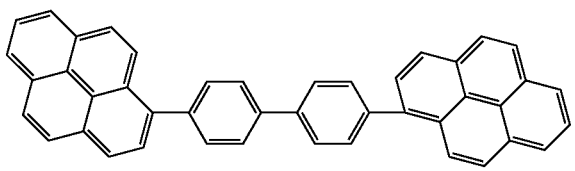

Further, a voltage was applied for 100 hours under a nitrogen atmosphere while a current density was kept at 30 mA/cm². As a result, an initial luminance of 450 cd/m² reduced to 160 cd/m² in 100 hours. This means that luminance deterioration was large.

Examples 5 to 8

Devices were each produced in the same manner as in Example 4 except that any one of the compounds shown in Table 1 was used instead of Exemplified Compound 4 serving as the light-emitting layer 3 of Example 4, and were each evaluated in the same manner as in Example 4. Table 1 shows the results.

TABLE 1

| Example | Exemplified Compound No. | Applied Voltage (V) | Luminance (cd/m²) | Efficiency (lm/W) | Center wavelength (nm) |
|---|---|---|---|---|---|
| 5 | 5 | 4 | 2200 | 6.1 | 515 |
| 6 | 11 | 4 | 455 | 2.1 | 460 |
| 7 | 1 | 4 | 440 | 2.0 | 455 |
| 8 | 1-1 | 4 | 420 | 1.9 | 448 |

Example 9

An organic light-emitting device was produced in the same manner as in Example 5 except that Exemplified Compound 4 described above as a first compound and a compound shown below as a second compound were co-vapor-deposited (at a weight ratio of 90:10) to provide the light-emitting layer 3 having a thickness of 20 nm instead of the light-emitting layer 3 of Example 4.

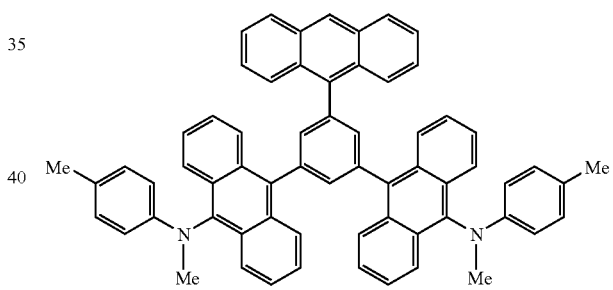

A voltage of 4 V was applied to the device thus obtained while the ITO electrode (i.e., anode 2) was used as a positive electrode and the Al—Li electrode (i.e., cathode 4) was used as a negative electrode. As a result, the device was observed to emit green light having an emission luminance of 2,300 cd/m², a luminous efficiency of 6.5 lm/W, and a center wavelength of 520 nm.

Further, a voltage was applied for 100 hours under a nitrogen atmosphere while a current density was kept at 30 mA/cm². As a result, an initial luminance of 2,400 cd/m² reduced to 1,900 cd/m² in 100 hours. This means that luminance deterioration was small.

Examples 10 to 12

Devices were each produced in the same manner as in Example 9 except that any one of the compounds shown in Table 2 was used instead of the first compound serving as the light-emitting layer 3 of Example 9, and were each evaluated in the same manner as in Example 9. Table 2 shows the results.

TABLE 2

| Example | First compound No. | Applied voltage (V) | Luminance (cd/m²) | Efficiency (lm/W) | Center Wavelength (nm) |
|---|---|---|---|---|---|
| 10 | 5 | 4 | 3200 | 8.3 | 518 |
| 11 | 8 | 4 | 2500 | 6.5 | 515 |
| 12 | 11 | 4 | 2450 | 6.3 | 515 |

Comparative Example 2

An organic light-emitting device was produced in the same manner as in Example 4 except that an exemplified compound shown below as a first compound was used instead of the light-emitting layer 3 of Example 4.

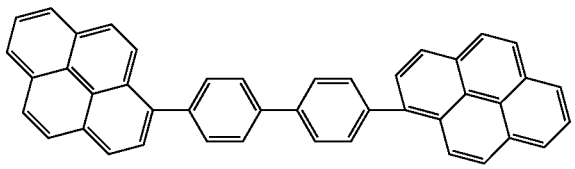

A voltage of 4 V was applied to the device thus obtained while the ITO electrode (i.e., anode 2) was used as a positive electrode and the Al—Li electrode (i.e., cathode 4) was used as a negative electrode. As a result, the device was observed to emit green light having an emission luminance of 1,500 cd/m², a luminous efficiency of 3.5 lm/W, and a center wavelength of 515 nm.

Further, a voltage was applied for 100 hours under a nitrogen atmosphere while a current density was kept at 30 mA/cm². As a result, an initial luminance of 1,550 cd/m² reduced to 550 cd/m² in 100 hours. This means that luminance deterioration was large.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-245220, filed Aug. 26, 2005, which is hereby incorporated by reference herein in its entirety.

What is claimed is:

1. A corannulene compound represented by the following general formula:

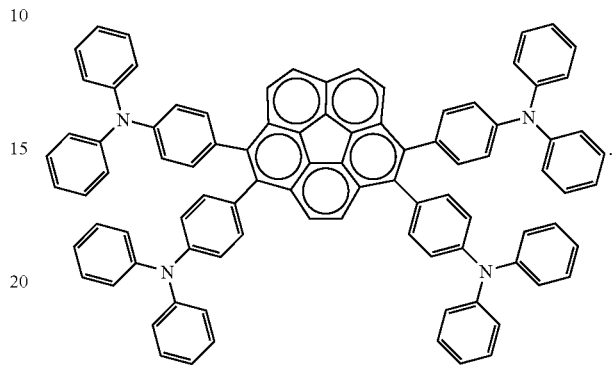

2. An organic light-emitting device comprising:
a pair of electrodes; and
an organic compound layer interposed between the pair of electrodes,
wherein the organic compound layer comprises the corannulene compound according to claim 1.

3. The organic light-emitting device according to claim 2, wherein the organic compound layer is an light-emitting layer.

4. The organic light-emitting device according to claim 2, wherein the organic compound layer is an electron-transporting layer and the organic light-emitting device further comprises a light-emitting layer.

5. The organic light-emitting device according to claim 2, wherein the organic compound layer is a hole-transporting layer and the organic light-emitting device further comprises a light-emitting layer.

* * * * *